(12) United States Patent
Sato et al.

(10) Patent No.: US 10,612,762 B2
(45) Date of Patent: Apr. 7, 2020

(54) WAVELENGTH CONVERSION MEMBER, MANUFACTURING METHOD THEREFOR, AND LIGHT-EMITTING DEVICE

(71) Applicant: NGK SPARK PLUG CO., LTD., Nagoya, Aichi (JP)

(72) Inventors: Yumi Sato, Sendai (JP); Yoshifumi Tsutai, Tomiya (JP); Takashi Abe, Tomiya (JP); Yutaka Sato, Funabashi (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/088,566

(22) PCT Filed: Feb. 3, 2017

(86) PCT No.: PCT/JP2017/004087
§ 371 (c)(1),
(2) Date: Sep. 26, 2018

(87) PCT Pub. No.: WO2017/169117
PCT Pub. Date: Oct. 5, 2017

(65) Prior Publication Data
US 2019/0093871 A1 Mar. 28, 2019

(30) Foreign Application Priority Data
Mar. 29, 2016 (JP) .................. 2016-066606

(51) Int. Cl.
*F21V 29/70* (2015.01)
*C09K 11/08* (2006.01)
(Continued)

(52) U.S. Cl.
CPC .............. *F21V 29/70* (2015.01); *C09K 11/08* (2013.01); *C09K 11/7706* (2013.01); *F21K 9/64* (2016.08);
(Continued)

(58) Field of Classification Search
CPC .................. C09K 11/08; F21K 9/64
See application file for complete search history.

(56) References Cited

U.S. PATENT DOCUMENTS

| 2014/0166902 A1 | 6/2014 | Berben et al. |
| 2015/0204494 A1 | 7/2015 | Wada et al. |
| 2017/0137706 A1 | 5/2017 | Fujita et al. |

FOREIGN PATENT DOCUMENTS

| JP | 2013-207049 A | 10/2013 |
| JP | 2014-522116 A | 8/2014 |

(Continued)

OTHER PUBLICATIONS

Japan Patent Office, International Search Report issued in corresponding Application No. PCT/JP2017/004087, dated Apr. 25, 2017.

(Continued)

*Primary Examiner* — Anh T Mai
*Assistant Examiner* — Zachary J Snyder
(74) *Attorney, Agent, or Firm* — Stites & Harbison, PLLC; Jeffrey A. Haeberlin; Gary N. Stewart (57) ABSTRACT

The invention provides a wavelength conversion member which can draw heat efficiently away from a region that is prone to generating heat under irradiation of light with a high energy density and which can suppress the thermal quenching of phosphor, and provides a method for manufacturing such wavelength conversion members, and a light-emitting device having such a wavelength conversion member.

(Continued)

A wavelength conversion member 100 of reflection type is configured to convert light with a specific wavelength to light with other wavelength and also configured to reflect the light on a reflection surface, thereby emitting the light as illumination light, wherein the wavelength conversion member 100 includes a transmissive element 110 including an inorganic material and being optically transmissive, a phosphor layer 120 joined to the transmissive element 110 and including phosphor particles that absorb light and emit converted light and a translucent ceramic that binds the phosphor particles to one another, and a reflector 130 disposed in contact with a side of the phosphor layer 120 opposite to the transmissive element 110 and defining the reflection surface on which the converted light is reflected. With this configuration, heat can be dissipated efficiently from a region that is prone to generating heat under irradiation of light with a high energy density, and the thermal quenching of phosphor can be suppressed.

7 Claims, 6 Drawing Sheets

(51) Int. Cl.
*G02B 5/20* (2006.01)
*H01L 33/50* (2010.01)
*F21K 9/64* (2016.01)
*F21V 9/32* (2018.01)
*C09K 11/77* (2006.01)
*F21V 13/08* (2006.01)
*F21Y 115/30* (2016.01)
*F21Y 115/10* (2016.01)

(52) U.S. Cl.
CPC ............... *F21V 9/32* (2018.02); *F21V 13/08* (2013.01); *G02B 5/20* (2013.01); *H01L 33/50* (2013.01); *F21Y 2115/10* (2016.08); *F21Y 2115/30* (2016.08)

(56) References Cited

FOREIGN PATENT DOCUMENTS

| | | |
|---|---|---|
| JP | 2014-241431 A | 12/2014 |
| JP | 2015-038960 A | 2/2015 |
| JP | 2015-065425 A | 4/2015 |
| JP | 2015-090887 A | 5/2015 |
| JP | 2015-119172 A | 6/2015 |
| JP | 2015-138839 A | 7/2015 |
| JP | 2015-213076 A | 11/2015 |
| JP | 2016-027613 A | 2/2016 |

OTHER PUBLICATIONS

Japan Patent Office, Written Opinion issued in corresponding Application No. PCT/JP2017/004087, dated Apr. 25, 2017.

(a) SEM IMAGE (b) SILICON ELEMENT MAPPING IMAGE

FIG. 5

(a) SEM IMAGE (SHOWING POSITION OF ELEMENT COUNTING LINE)

(b) ELEMENT COUNTING (Si)

WAVELENGTH CONVERSION MEMBER, MANUFACTURING METHOD THEREFOR, AND LIGHT-EMITTING DEVICE

TECHNICAL FIELD

The present invention relates to a wavelength conversion member of reflection type that converts light with a specific wavelength to light with other wavelength and also reflects the light on a reflection surface to emit the light as illumination light, to a method for the manufacturing of such wavelength conversion members, and to a light-emitting device.

BACKGROUND ART

Light-emitting elements are known in which, for example, a wavelength conversion member in which phosphor particles are dispersed in a resin such as epoxy or silicone is disposed in contact with a blue LED element. In recent applications, LEDs are increasingly replaced by laser diodes (LDs) which have a high energy efficiency and are easily adaptable to miniaturization and increase in output.

Lasers apply high-energy light to a local site. When laser light is focused onto a resin, the irradiated site is burnt. A known approach to this problem is to use all-inorganic wavelength conversion members that contain an inorganic binder in place of a resin which constitutes the wavelength conversion member (Patent Literatures 1 to 6).

Further, wavelength conversion members have been presented in which a phosphor layer is enclosed in contact with or interposed between heatsinks (Patent Literature 7). Patent Literature 7, however, does not explicitly describe how and which portion of the phosphor layer is placed in contact with the heatsinks.

CITATION LIST

Patent Literature

PTL 1: Japanese Unexamined Patent Application Publication No. 2015-90887
PTL 2: Japanese Unexamined Patent Application Publication No. 2015-38960
PTL 3: Japanese Unexamined Patent Application Publication No. 2015-65425
PTL 4: Japanese Unexamined Patent Application Publication No. 2014-241431
PTL 5: Japanese Unexamined Patent Application Publication No. 2015-119172
PTL 6: Japanese Unexamined Patent Application Publication No. 2015-138839
PTL 7: Japanese Unexamined Patent Application Publication No. 2015-213076

SUMMARY OF INVENTION

Technical Problem

Such wavelength conversion members described above that use an inorganic binder attain enhanced heat resistance of the material itself. If, however, phosphor particles generate heat by being excited by high-energy laser light and an increased amount of heat is stored, even those wavelength conversion members can lose the luminescent performance of the phosphor particles. In particular, a reflection-type wavelength conversion member has a larger distance between a region which generates a major proportion of heat and a reflector which has a heat dissipation function, and thus tends to store more heat. Further, a phosphor layer and a reflector are made of different materials and the difference in their thermal expansions may lead to breakage of the wavelength conversion member.

The present invention has been made in light of the circumstances described above. Objects of the invention are therefore to provide a wavelength conversion member which can draw heat efficiently away from a region that is prone to generating heat under irradiation of light with a high energy density and which can suppress the thermal quenching of phosphor, and to provide a method for manufacturing such wavelength conversion members, and a light-emitting device having such a wavelength conversion member.

Solution to Problem (1) To achieve the above objects, a wavelength conversion member of the present invention is of reflection type configured to convert light with a specific wavelength to light with other wavelength and also configured to reflect the light on a reflection surface, thereby emitting the light as illumination light, wherein the wavelength conversion member includes a transmissive element including an inorganic material and being optically transmissive, a phosphor layer joined to the transmissive element and including phosphor particles that absorb light and emit converted light and a translucent ceramic that binds the phosphor particles to one another, and a reflector disposed in contact with a side of the phosphor layer opposite to the transmissive element and defining the reflection surface on which the converted light is reflected. With this configuration, heat can be dissipated efficiently from a region that is prone to generating heat under irradiation of light with a high energy density, and the thermal quenching of phosphor can be suppressed.

(2) In the wavelength conversion member of the invention, the phosphor layer is joined to the transmissive element by chemical bonding, and the reflector is in simple physical contact with the phosphor layer without any medium. Because the phosphor layer is joined to the transmissive element by chemical bonding, the thermal conduction from the phosphor layer to the transmissive element is increased. Further, problems such as breakage due to thermal expansion can be prevented because of the reflector and the phosphor layer having a simple physical contact therebetween.

(3) In the wavelength conversion member of the invention, the phosphor layer has a structure such that when analyzed by elementary analysis to count translucent ceramic components with respect to a straight line perpendicular to a joint surface between the transmissive element and the phosphor layer, the count of the translucent ceramic components reaches maximum at a distance from the joint surface of not more than 15 μm. With this configuration, the translucent ceramic buries gaps between the phosphor particles at the joint surface between the transmissive element and the phosphor layer so as to ensure routes through which heat is drawn by the transmissive element, with the result that the heat dissipation function is enhanced.

(4) In the wavelength conversion member of the invention, the transmissive element includes sapphire. With this configuration, high thermal conductivity can be obtained while ensuring translucency, and thus the temperature rise of the phosphor layer can be suppressed.

(5) In the wavelength conversion member of the invention, the reflector is fastened by an external force while being in contact with the phosphor layer. With this configuration, the reflector can be disposed in physical contact with the phosphor layer to make it possible to prevent problems such as breakage due to thermal expansion.

(6) The wavelength conversion member of the invention is also characterized in that when the wavelength conversion member is irradiated with source light having a specific wavelength at a power density of 5 W/mm$^2$, the fluorescent intensity of the phosphor layer is not less than 50% of the maximum fluorescent intensity of the phosphor layer. Because the heat dissipation effect is high, the wavelength conversion member can maintain the fluorescent performance even when caused to emit light at a high output, and also can be prevented from problems such as breakage due to thermal expansion.

(7) A light-emitting device of the present invention includes a light source which generates source light having a specific wavelength, and the wavelength conversion member described in any of Claims 1 to 6 which absorbs the source light and emits light with other wavelength converted from the source light. The light-emitting device having this configuration can maintain fluorescent performance even when irradiated with source light having a high intensity.

(8) A method for manufacturing a wavelength conversion member of the present invention is a method for manufacturing a wavelength conversion member of reflection type configured to convert light with a specific wavelength to light with other wavelength and also configured to reflect the light on a reflection surface, thereby emitting the light as illumination light, the method including a step of applying a paste that is a mixture including an inorganic binder, a dispersion medium and phosphor particles to a transmissive element including a transmissive inorganic material, a step of drying and heat treating the paste applied onto the transmissive element to form a phosphor layer, and a step of arranging a reflector including a light-reflective inorganic material onto the phosphor layer and fastening the reflector thus arranged. With this configuration, it is possible to manufacture a wavelength conversion member which can draw heat efficiently away from a region that is prone to generating heat under irradiation of light with a high energy density and which can suppress the thermal quenching of the phosphor.

Advantageous Effects of Invention

According to the present invention, heat can be dissipated efficiently from a region that is prone to generating heat under irradiation of light with a high energy density, and the thermal quenching of phosphor can be suppressed.

DESCRIPTION OF EMBODIMENTS

Next, embodiments of the present invention will be described with reference to the drawings. To facilitate the understanding of the description, the same reference numerals will be used for equivalent features in the drawings, and overlaps in the description will be omitted. In the drawings, the size of the elements is only illustrative and is not to actual scale.

[Configurations of Light-Emitting Devices]

Figure 1:
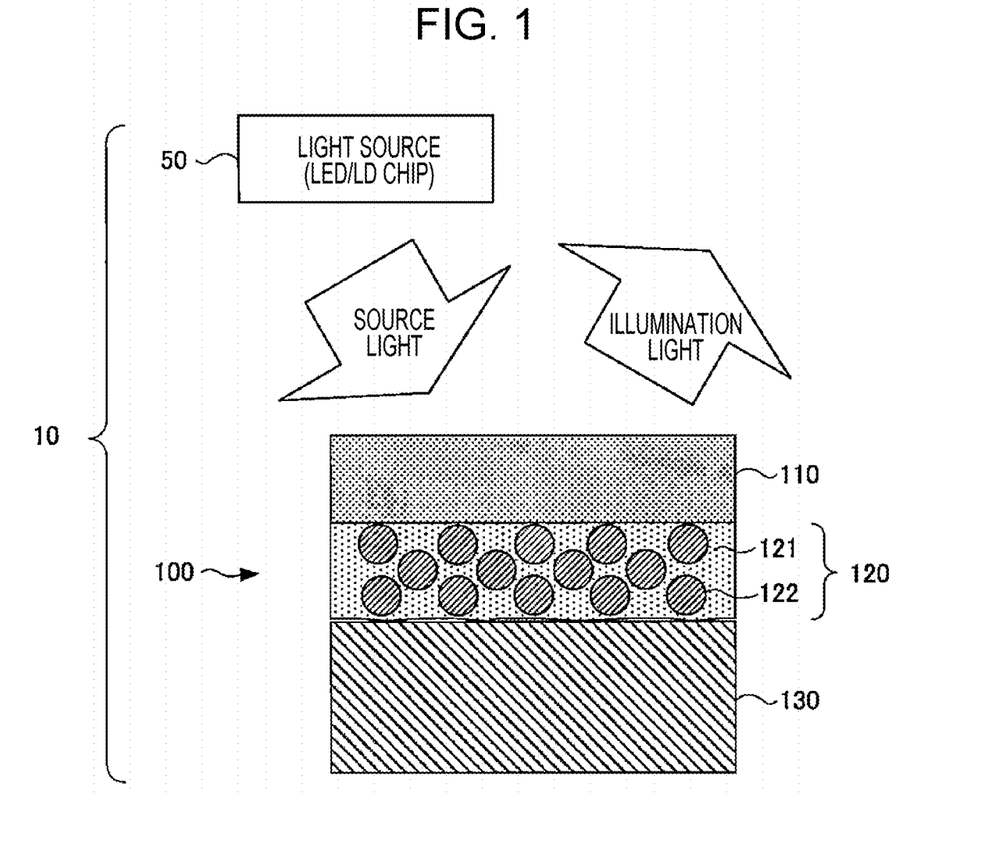
FIG. 1 is a schematic view of a light-emitting device of reflection type according to the present invention.

FIG. 1 is a schematic view of a reflection-type light-emitting device 10. As illustrated in FIG. 1, the light-emitting device 10 includes a light source 50 and a wavelength conversion member 100 and is configured so that, for example, source light reflected by the wavelength conversion member 100 and light generated within the wavelength conversion member 100 by excitation with the source light are combined and emitted as illumination light. The illumination light may be, for example, white light.

The light source 50 may be a chip of an LED (light-emitting diode) or an LD (laser diode). An LED generates source light having a specific range of wavelength in accordance with the design of the light-emitting device 10. For example, the LED generates ultraviolet light, violet light or blue light. When an LD is used, coherent light having little variations in wavelength and phase can be generated. The light source 50 is not limited to those described above and may be a light source that emits light other than visible lights. A preferred light source is one that generates ultraviolet light, violet light, blue light or green light.

[Configurations of Wavelength Conversion Members]

The wavelength conversion member 100 includes a transmissive element 110, a phosphor layer 120 and a reflector 130, and is sheet-shaped and is configured to reflect source light on the reflector 130 and to be excited by the source light so as to generate light with a different wavelength.

(Transmissive Elements)

The transmissive element 110 includes an inorganic material having a higher coefficient of thermal conductivity than the phosphor layer 120, and permits the passage of light. The transmissive element 110 that has high thermal conductivity draws heat away from within the phosphor layer 120, and can thereby suppress a temperature rise of the phosphor particles and can prevent thermal quenching. The transmissive element preferably includes sapphire, in which case the transmissive element can ensure high thermal conductivity while allowing the passage of light and thus can suppress a temperature rise of the phosphor layer 120.

(Reflectors)

The reflector 130 includes a sheet-shaped inorganic material that reflects source light, such as an aluminum sheet. To increase the reflectance, the reflector 130 may be specular finished or may be coated with a highly reflective film (for example, an Ag coating). Use as the reflector may be made of mirror-coated glass or sapphire. The reflector 130 is disposed in contact with the side of the phosphor layer 120 opposite to the transmissive element 110. The wavelength conversion member reflects the converted light on the reflection surface of its reflector 130 or reflects the converted light using the surface of a reflector 130 adjacent to the wavelength conversion member as the reflection surface. For example, the reflector 130 allows illumination light to be emitted by reflecting blue source light and also reflecting green and red or yellow fluorescences converted in the phosphor layer. The reflector is in contact with peaks of the irregularities present on the surface of the phosphor layer, and thus the contact area is small.

The reflector 130 is preferably fastened by an external force while being in contact with the phosphor layer 120. The external force may be anything that fixes the outer periphery. For example, the external force is preferably provided by a specifically-designed holder, or may be offered by an adhesive.

With the configuration described above, the reflector can be disposed in physical contact with the phosphor layer 120 to make it possible to prevent problems such as breakage due to thermal expansion. An adhesive, when applied to the entire surface, is separated by the difference in thermal expansion, and therefore the application is limited to portions of the lateral side. A resin adhesive can deal with different thermal expansions even if it is applied to the entire surface, but is still not suitable because the resin is burnt by the heat generated by the phosphor portions during use. Little effect is obtained when a heat dissipation member is arranged on the side opposite to the light incident side. When a heat dissipation member is installed, one which has a high coefficient of thermal conductivity is preferable from the point of view of heat dissipation. It is, however, not necessarily required that a heat dissipation member be provided.

Figure 2:
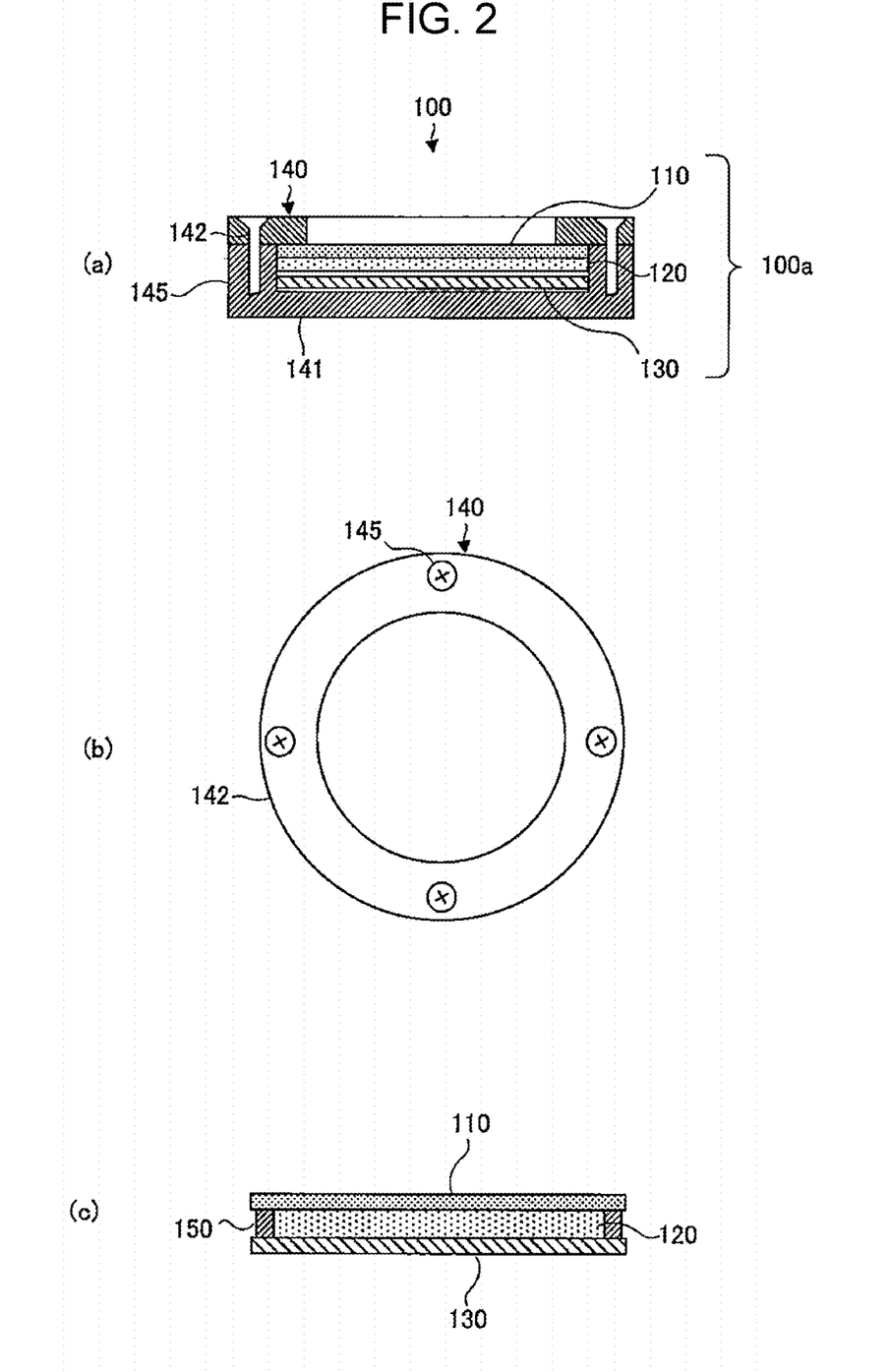
FIGS. 2(a), 2(b) and 2(c) are a sectional view and a plan view of a wavelength conversion member using a holder, and a sectional view of a wavelength conversion member using an adhesive, respectively.

FIGS. 2(a) and 2(b) are a sectional view and a plan view of a wavelength conversion member using a holder. A holder 140 includes a case 141 accommodating a wavelength conversion member body 100a, and a cover member 142 disposed at the edge of the open end of the case 141, and has a sheet-like shape when the open end is closed with the cover member 142. While the drawing illustrates the unit as being a substantially circular disk, the peripheral shape is not necessarily a circle and the unit may take various shapes depending on use. The wavelength conversion member body 100a in this instance is composed of a transmissive element 110, a phosphor layer 120 and a reflector 130.

The case 141 and the cover member 142 are made of such a material as resin, glass or ceramic. The cover member 142 has a ring shape and allows light to be incident on the wavelength conversion member body and allows illumination light from the wavelength conversion member body to pass through the central opening. The case 141 and cover member 142 of the holder 140 have a locking mechanism for fastening the wavelength conversion member body 100a in close contact therewith. In the illustrated example, screw holes are disposed at corresponding positions of the edge of the open end of the case 141, and the cover member 142, and screws 145 serve as the locking mechanism. In this manner, the wavelength conversion member body 100a can be secured by screws inside the case 141.

FIG. 2(c) is a sectional view of a wavelength conversion member using an adhesive. While the example illustrated above fastens the phosphor layer and the reflector with the holder, the fastening between the phosphor layer 120 and the reflector 130 may be achieved by applying an adhesive 150 to an outer peripheral portion that will not be irradiated with laser light. In the example illustrated in FIG. 2(c), the phosphor layer 120 is formed with a slightly smaller size than the transmissive element 110, and the space under the transmissive element 110 and outside the phosphor layer 120 is filled with an adhesive 150. Because the portion filled with the adhesive is outside the reach of laser light and is thus not heated, the adhesive may be an inorganic adhesive or an organic adhesive.

(Phosphor Layers)

The phosphor layer 120 is provided in the form of a film joined to the transmissive element 110, and is formed from phosphor particles 122 and a translucent ceramic 121. The translucent ceramic 121 binds the phosphor particles 122 to one another and also binds the transmissive element 110 and the phosphor particles 122. With this configuration, a region on the incident side which is more prone to generating heat upon irradiation with light at a high energy density is joined with the transmissive element 110 that functions as a heat dissipation member, and consequently heat can be dissipated efficiently and the thermal quenching of the phosphor can be suppressed. The average particle size of the phosphor and the film thickness of the phosphor layer 120 are preferably such that the ratio of the film thickness to the phosphor particle size falls in the range described in the table below.

TABLE 1

| Average particle size [μm] | | Film thickness/ Particle size | |
|---|---|---|---|
| Not less than | Less than | Not less than | Less than |
| — | 1 | 2 | 30 |
| 1 | 5 | 2 | 15 |
| 5 | 10 | 2 | 10 |
| 10 | — | 1.5 | 5 |

In the structure of the phosphor layer 120, the translucent ceramic components bury gaps between the phosphor particles at and near the interface between the phosphor layer and the transmissive element 110. Specifically, the phosphor layer 120, when analyzed by elementary analysis to count the translucent ceramic components with respect to a straight line perpendicular to the joint surface between the transmissive element 110 and the phosphor layer 120, shows that the count of the translucent ceramic components reaches maximum at a distance from the joint surface of not more than 15 μm. With this configuration, the translucent ceramic 121 buries gaps between the phosphor particles 122 at the joint surface between the transmissive element 110 and the phosphor layer 120 so as to ensure routes through which heat is drawn by the transmissive element 110, with the result that the heat dissipation function is enhanced.

The phosphor layer 120 is joined to the transmissive element 110 by chemical bonding, and the reflector is in simple physical contact with the phosphor layer 120 without any medium. Because the phosphor layer 120 is joined to the transmissive element 110 by chemical bonding, the thermal conduction from the phosphor layer 120 to the transmissive element 110 is increased. Further, problems such as breakage due to thermal expansion can be prevented because of the reflector 130 and the phosphor layer 120 having a simple physical contact therebetween.

The phosphor layer 120 is formed with as small a thickness as possible, as long as the desired color design is feasible. This configuration makes it possible to suppress thermal quenching by the generation of heat (the storage of heat) of the phosphor particles 122 even in the case where the source light is laser light having a high energy density.

The translucent ceramic 121 is an inorganic binder that serves to hold the phosphor particles 122 together, and includes, for example, silica ($SiO_2$) or aluminum phosphate. For example, the phosphor particles 122 may be an yttrium/aluminum/garnet-based phosphor (YAG-based phosphor) and a lutetium/aluminum/garnet-based phosphor (LAG-based phosphor).

Further, phosphor particles of the following materials may be selected in accordance with the design of a color to be emitted. Examples of such phosphors include blue phosphors such as $BaMgAl_{10}O_{17}$:Eu, ZnS:Ag, Cl, $BaAl_2S_4$:Eu and $CaMgSi_2O_6$:Eu, yellow or green phosphors such as $Zn_2SiO_4$:Mn, (Y,Gd)$BO_3$:Tb, ZnS:Cu, Al, (M1)$_2SiO_4$:Eu, (M1) (M2)$_2$S:Eu, (M3)$_3Al_5O_{12}$:Ce, SiAlON:Eu, CaSiAlON:Eu, (M1)$Si_2O_2N$:Eu and (Ba,Sr,Mg)$_2SiO_4$:Eu, Mn, yellow, orange or red phosphors such as (M1)$_3SiO_5$:Eu and (M1)S:Eu, and red phosphors such as (Y,Gd)$BO_3$:Eu, $Y_2O_2S$:Eu, (M1)$_2Si_5N8$:Eu, (M1)$AlSiN_3$:Eu and $YPVO_4$:Eu. In these formulae, M1 includes at least one selected from the group consisting of Ba, Ca, Sr and Mg, M2 includes at least one of Ga and Al, and M3 includes at least one selected from the group consisting of Y, Gd, Lu and Te. The phosphor particles described above are only examples, and the phosphor particles used in the wavelength conversion member are not necessarily limited to those mentioned above.

The porosity of the phosphor layer 120 is not less than 30% and not more than 70%. When the wavelength conversion member 100 is irradiated with source light at a power density of 5 W/mm$^2$, the fluorescent intensity of the phosphor layer is preferably not less than 50% of the maximum fluorescent intensity of the phosphor layer. Because the heat dissipation effect is high, the wavelength conversion member can maintain the fluorescent performance even when caused to emit light at a high output and thus can be prevented from problems such as breakage due to thermal expansion. Such a light-emitting device 10 is expected to provide high effects when applied to, for example, illumination of factories and public facilities such as stadiums and art museums where a large area is illuminated from a height, or long-distance illumination such as automobile headlight lamps.

[Methods for Fabricating Wavelength Conversion Members]

Figure 3:
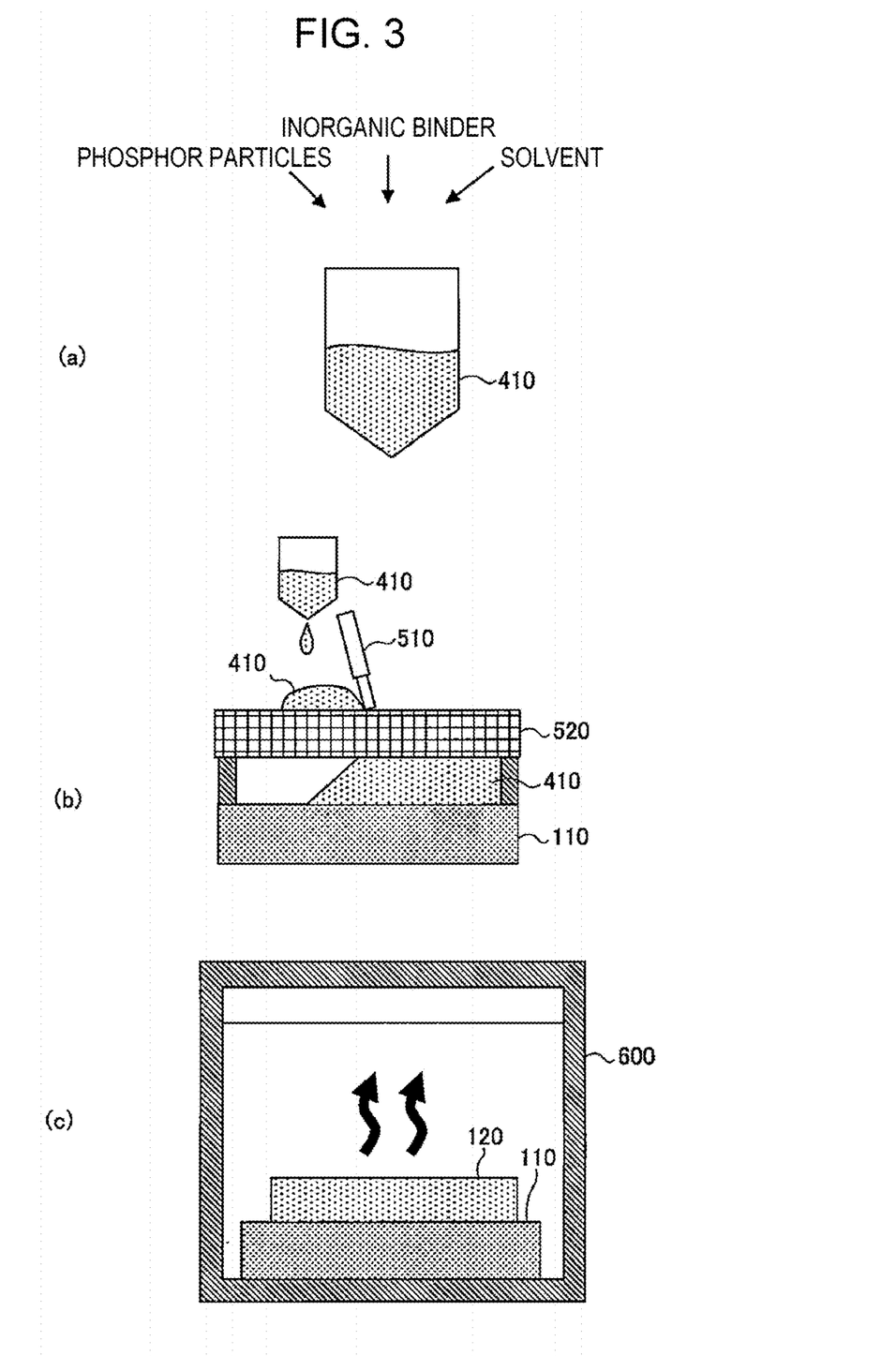
FIGS. 3(a), 3(b) and 3(c) are each a sectional view illustrating a step in the fabrication of a wavelength conversion member of the present invention.

FIGS. 3(a), 3(b) and 3(c) are each a sectional view illustrating a step in the fabrication of a wavelength conversion member. First, an inorganic binder, a dispersion medium and phosphor particles are provided. For example, a preferred inorganic binder may be ethyl silicate obtained by dissolving a silicon precursor into ethanol.

Alternatively, the inorganic binder may be one obtained by reacting at room temperature or heat treating at a temperature of not more than 500° C. a raw material including at least one selected from the group consisting of silicon oxide precursors which form silicon oxide by hydrolysis or oxidation, silicic acid compounds, silica and amorphous silica. Examples of the silicon oxide precursors include those based on perhydropolysilazane, ethyl silicate or methyl silicate.

The dispersion medium may be a high-boiling solvent such as butanol, isophorone, terpineol or glycerol. For example, the phosphor particles may be particles of YAG, LAG and the like. The types and amounts of the phosphor particles are controlled depending on the target illumination light in association with the source light. When, for example, white light is to be obtained from blue light, appropriate amounts of particles of phosphors that are excited by blue light to emit green light and red or yellow light are selected.

As illustrated in FIG. 3(a), the inorganic binder, the dispersion medium and the phosphor particles are mixed with each other to give a paste (an ink) 410. The mixing may be performed with a device such as a ball mill. Separately, a transmissive element made of an inorganic material is provided. The transmissive element may be glass or sapphire. The transmissive element is preferably in the form of a sheet.

Next, as illustrated in FIG. 3(b), the paste 410 is applied onto the transmissive element 110 by a screen printing method so that the film thickness will have a ratio to the average particle size in the range described in the table hereinabove. The screen printing may be performed by squeezing the paste 410 through a framed silk screen 520 with use of an ink squeegee 510. Besides screen printing, the paste may be applied by spraying, dispenser drawing or inkjetting. A screen printing method is preferable in order to form a thin phosphor layer stably. The application method is not limited to printing and may be any of other techniques.

The printed paste 410 is then dried and is heat treated in a furnace 600 to evaporate the solvent as well as to drive off the organic matter in the inorganic binder and to oxidize the predominant metal in the inorganic binder (when the predominant metal is Si, to convert the metal into $SiO_2$) while performing bonding of the phosphor layer 120 with the transmissive element 110.

A reflector 130 including a light-reflective inorganic material is arranged onto the phosphor layer 120, and the reflector thus arranged is fastened. In the manner described above, a wavelength conversion member 100 may be manufactured which can draw heat efficiently away from a region that is prone to generating heat under irradiation of light with a high energy density and which can suppress the thermal quenching of the phosphor.

A light-emitting device may be fabricated by appropriately arranging a wavelength conversion member which has a transmissive element suited for reflection, with respect to a light source such as an LED.

EXAMPLES (1. Evaluation of Joint State)
(1-1) Sample Fabrication Method

Wavelength conversion members of Example 1 and Comparative Examples 1 and 2 were fabricated. First, a paste was prepared by mixing ethyl silicate and terpineol with YAG phosphor particles (average particle size 18 μm).

Figure 4:
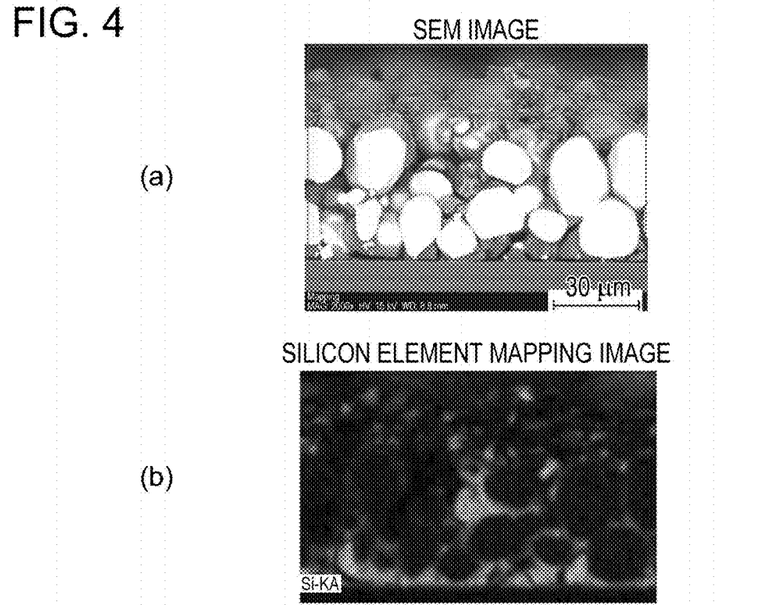
FIGS. 4(a) and 4(b) are a SEM image and a Si element mapping image thereof, respectively, of a partial cross section of a wavelength conversion member according to the present invention.

The paste prepared was applied to a sapphire sheet as a transmissive element by a screen printing method so that the film thickness would be 40 μm, and the wet film was heat treated, thereby obtaining an intermediate. A cross section of the intermediate perpendicular to the reflection surface was observed by SEM. FIG. 4(a) is a SEM image of a partial cross section of a wavelength conversion member (a cross section of the intermediate). FIG. 4(b) is a Si element mapping image of the partial cross section of the wavelength conversion member illustrated in the SEM image of FIG. 4(a). It was shown that the translucent ceramic (silica) had buried gaps between the phosphor particles at and near the interface with the transmissive element.

In the cross section of the sample illustrated in the SEM image, the inorganic binder serving as an adhesive layer is silica, and the transmissive element is sapphire. Necking is formed from a region where the silica is uniformly spread on the entire surface of the transmissive element, to a region where the phosphor layer is in contact.

Figure 5:
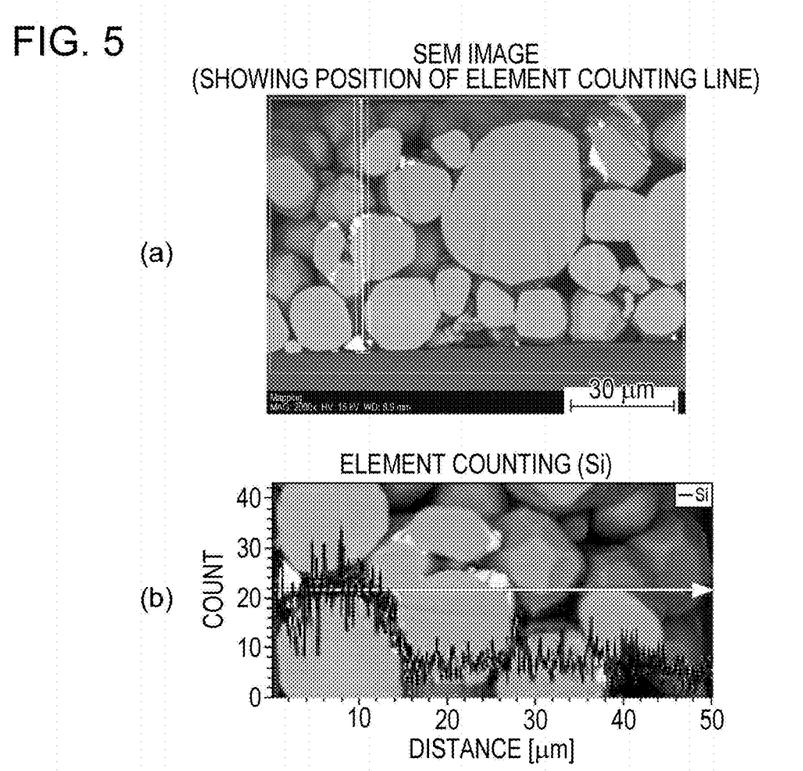
FIGS. 5(a) and 5(b) are a SEM image and an element counting image, respectively.

FIGS. 5(a) and 5(b) are a SEM image and an element counting image thereof, respectively, of a partial cross section of the wavelength conversion member. With respect to the position indicated by the element counting line in FIG. 5(a), the element in the phosphor layer was counted, the result being illustrated in FIG. 5(b). It was shown that an abundance of silica (the maximum count) was present in a region near the transmissive element (a distance of not more than 15 μm from the joint surface between the transmissive element and the phosphor layer, along the straight line perpendicular to the joint surface).

Subsequently, an aluminum sheet as a reflector was brought into contact with the intermediate and was fastened by the application of an external force. A wavelength conversion member of Example 1 was thus obtained. Separately, the paste was applied onto an aluminum sheet reflector by a screen printing method so that the film thickness would be 40 μm, and the wet film was heat treated, thereby obtaining a sample of Comparative Example 2. Further, a sapphire sheet as a transmissive element was brought into contact with the phosphor layer of another sample of Comparative Example 2, and was fastened by the application of an external force. A wavelength conversion member of Comparative Example 1 was thus obtained.

(1-2) Evaluation Method

The emission intensity and the emission efficiency retention ratio of the samples of Example 1 and Comparative Examples 1 and 2 obtained above were evaluated. Specifically, the samples were irradiated with laser light to examine the fluorescent emission intensity and the emission efficiency retention ratio at various laser input values. The fluorescent emission intensity is the relative intensity obtained by converting to dimensionless the value shown on a luminance meter during the measurement with the evaluation system. The emission efficiency retention ratio is the ratio of the emission efficiency at a given laser power density to the emission efficiency at a low laser power density where the influence of heat generation and heat storage is negligible, taken as 100%.

Figure 6:
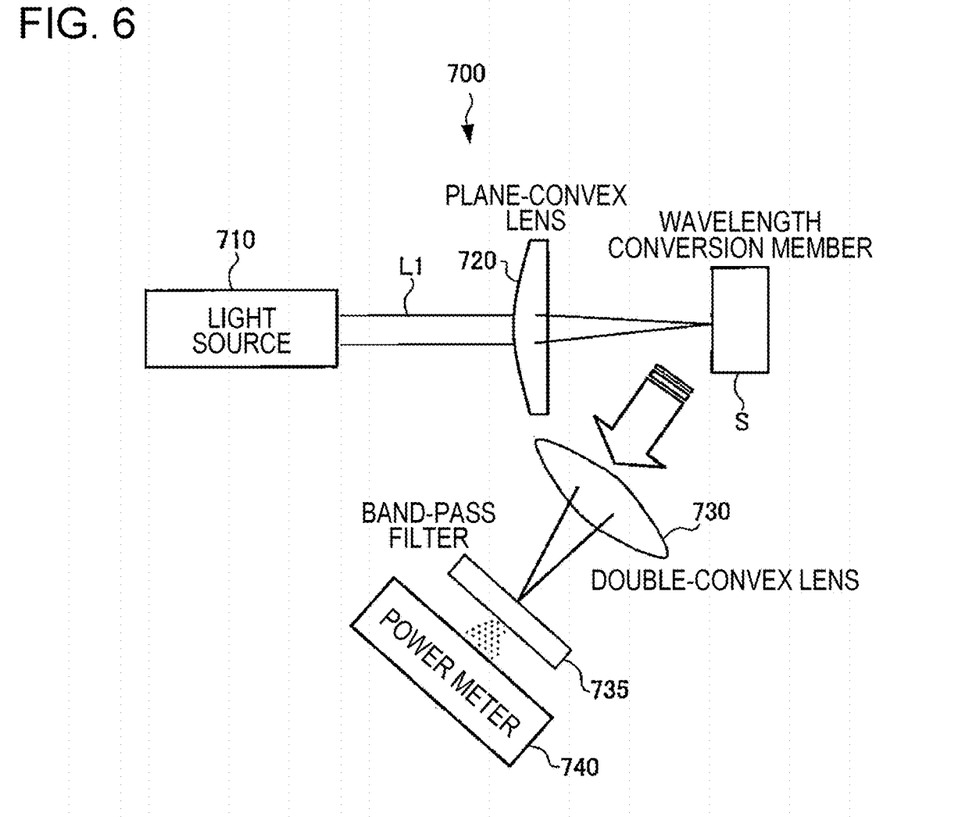
FIG. 6 is a sectional view illustrating a reflection-type system for evaluating a wavelength conversion member.

FIG. 6 is a sectional view illustrating a reflection-type evaluation system 700 for the evaluation of wavelength conversion members. As illustrated in FIG. 6, the reflection-type evaluation system 700 is composed of a light source 710, a plane-convex lens 720, a double-convex lens 730, a band-pass filter 735 and a power meter 740. These elements are arranged so that the light reflected from the wavelength conversion member 100 can be gathered and analyzed.

The band-pass filter 735 is a filter that blocks light with wavelengths of 480 nm and below, and is disposed between the double-convex lens and the power meter in the measurement of the fluorescent emission intensity in order to screen out the source light (excitation light) that has passed through, from the fluorescent light.

The source light that has entered into the plane-convex lens 720 is condensed to a focus on the sample S of wavelength conversion member. The radiation emitted from the sample S is gathered by the double-convex lens 730. The gathered light is filtered to screen out components with wavelengths of 480 nm and less, and the intensity of the remainder light is measured with the power meter 740. The value measured is the fluorescent emission intensity. By condensing the laser light with the lens to focus on a narrow irradiation area, the energy density per unit area can be increased even with a low-output laser. This energy density is the laser power density. The samples S obtained in Example 1 and Comparative Examples 1 and 2 were individually tested.

Figure 7:
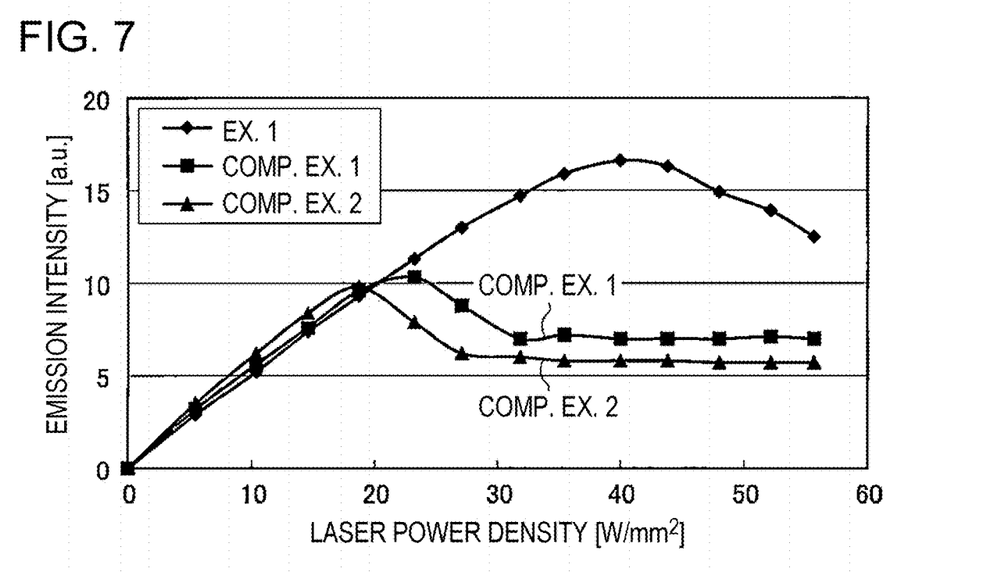
FIG. 7 is a graph illustrating the emission intensities of samples at various laser power densities.
Figure 8:
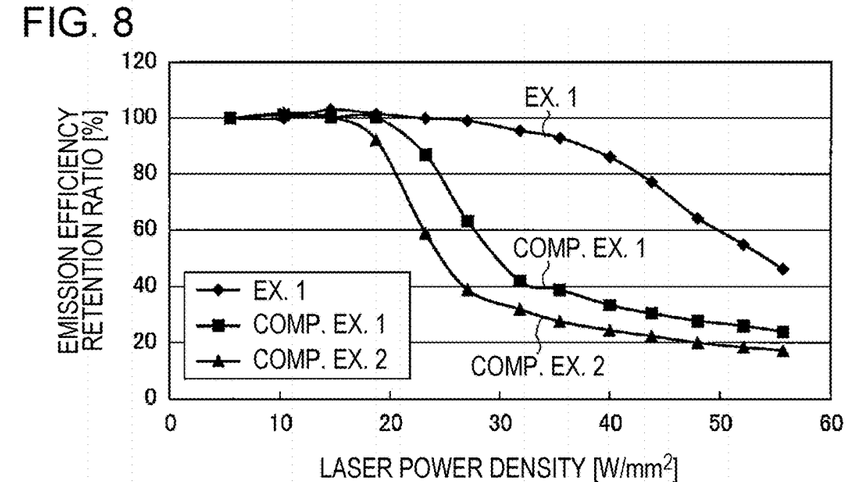
FIG. 8 is a graph illustrating the emission efficiency retention ratios of samples at various laser power densities.

FIG. 7 is a graph illustrating the emission intensities of the samples at various laser power densities. FIG. 8 is a graph illustrating the emission efficiency retention ratios of the samples at various laser power densities. In Comparative Example 2 in which no heat dissipation mechanism was disposed on the laser beam incident side, the phosphor was quenched at 18.7 W/mm$^2$. Comparative Example 1 in which a sapphire sheet was placed in contact with the laser irradiated side resulted in phosphor quenching at 23.2 W/mm$^2$.

In contrast, the sample from Example 1 in which a sapphire sheet was joined to the phosphor layer and an aluminum sheet was placed in contact with the phosphor layer maintained the fluorescent emission up to 40.0 W/mm$^2$. The reason for this is probably because the sapphire sheet (the transmissive element) allowed to dissipate the heat on the surface of the phosphor layer 120 that had been generated during the laser irradiation, and consequently less heat was stored in the wavelength conversion member 100 and the thermal quenching of the phosphor was successfully suppressed. As demonstrated above, what is important is whether or not there is a route through which heat is dissipated from the region, of the phosphor layer 120, which is struck first by the incident laser light. High effects of Example 1 have been thus confirmed.

Although slight suppression of phosphor quenching was seen in Comparative Example 1 in which the heat dissipation member was disposed in contact with the phosphor layer, the suppressive effect against thermal storage was low as compared to Example 1. This result has confirmed that a contact of a heat dissipation member is not as effective for heat dissipation as direct joining of a heat dissipation member to the laser irradiated side. Example 1 attained a far greater suppressive effect against thermal storage than Comparative Example 1, which has confirmed that little effect is obtained in heat dissipation even when a heat dissipation member is joined to the side opposite to the laser beam incident side. It has been also confirmed that heat dissipation is not significantly affected by whether or not an aluminum sheet is joined to the phosphor layer on the side opposite to the laser beam incident side.

(2. Evaluation of Metallization of Lateral Side)

The lateral side of the intermediate was metallized to give a sample which represented Comparative Example 3. The intermediate itself was used to represent Comparative Example 4. The emission intensities of these samples were evaluated by a transmission-type laser irradiation test described below, and the fluorescent emission intensities at various laser power densities were examined.

Figure 9:
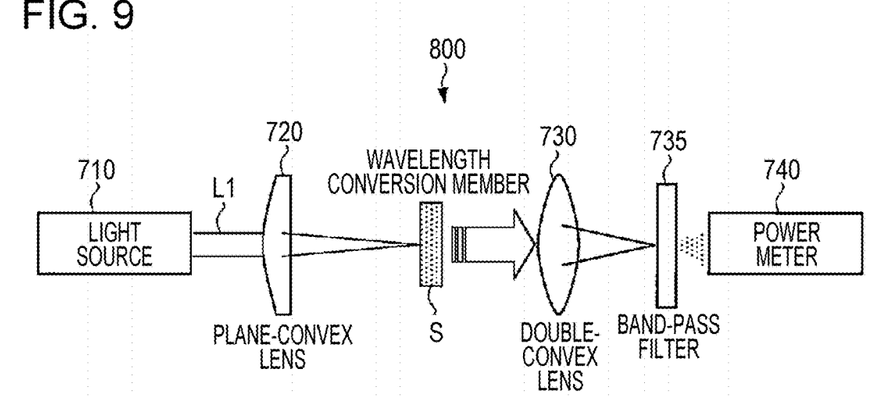
FIG. 9 is a sectional view illustrating a transmission-type system for evaluating a wavelength conversion member.

FIG. 9 is a sectional view illustrating a transmission-type evaluation system 800 for the evaluation of wavelength conversion members. As illustrated in FIG. 9, the transmission-type evaluation system 800 is composed of a light source 710, a plane-convex lens 720, a double-convex lens 730, a band-pass filter 735 and a power meter 740. In the evaluation system 800, the source light that has entered into the plane-convex lens 720 is condensed to a focus on the sample S. The sample S is the sample from Comparative Example 3 or 4.

Figure 10:
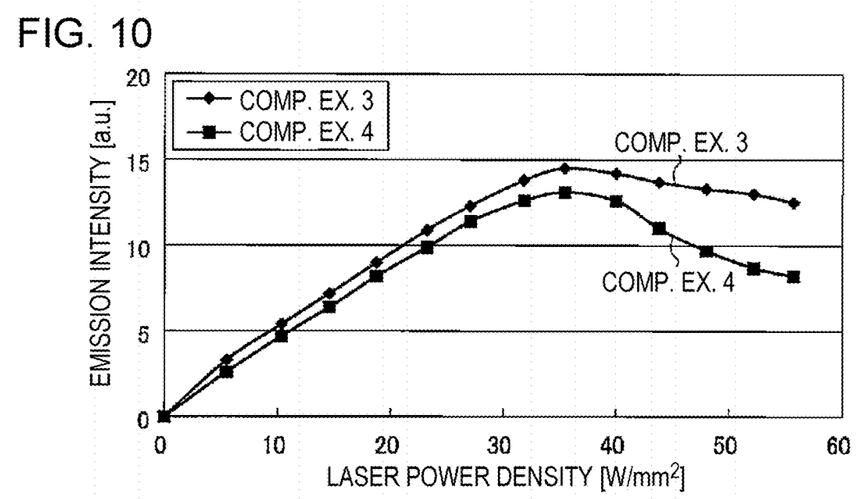
FIG. 10 is a graph illustrating the emission intensities of samples at various laser power densities.

FIG. 10 is a graph illustrating the emission intensities of the samples at various laser power densities. The emission intensity was higher and the quenching after saturation was slower in Comparative Example 3 than in Comparative Example 4. These results have confirmed that metallization is effective for heat dissipation. However, the phosphor quenching occurred at the same power density, showing that the heat dissipation effect by metallization is very low. As demonstrated above, a heat dissipation mechanism disposed on a lateral side slightly retards quenching, but its effect is low as shown by the fact that the saturation point is unchanged.

REFERENCE SIGNS LIST

10 LIGHT-EMITTING DEVICE
50 LIGHT SOURCE
100 WAVELENGTH CONVERSION MEMBER
100a WAVELENGTH CONVERSION MEMBER BODY
110 TRANSMISSIVE ELEMENT
120 PHOSPHOR LAYER
121 TRANSLUCENT CERAMIC
122 PHOSPHOR PARTICLES
130 REFLECTOR
140 HOLDER
141 CASE
142 COVER MEMBER
145 SCREW
150 ADHESIVE
410 PASTE
510 INK SQUEEGEE
520 SILK SCREEN
600 FURNACE
700, 800 EVALUATION SYSTEMS
710 LIGHT SOURCE
720 PLANE-CONVEX LENS
730 DOUBLE-CONVEX LENS
735 BAND-PASS FILTER
740 POWER METER
S SAMPLE

What is claimed is:

1. A wavelength conversion member of reflection type configured to convert light with a specific wavelength to light with other wavelength and also configured to reflect the light on a reflection surface, thereby emitting the light as illumination light, wherein the wavelength conversion member comprises:
   a transmissive element defined by sapphire, having a structural shape of a sheet, and being optically transmissive,
   a phosphor layer joined to the transmissive element and including phosphor particles that absorb light and emit converted light and a translucent ceramic that binds the phosphor particles to one another, and
   a reflector disposed in contact with a side of the phosphor layer opposite to the transmissive element and defining the reflection surface on which the converted light is reflected,
   wherein the transmissive element has a higher coefficient of thermal conductivity than the phosphor layer.

2. The wavelength conversion member according to claim 1, wherein the phosphor layer is joined to the transmissive element by chemical bonding, and
   the reflector is in simple physical contact with the phosphor layer without any medium.

3. The wavelength conversion member according to claim 1, wherein the phosphor layer has a structure such that when analyzed by elementary analysis to count translucent ceramic components with respect to a straight line perpendicular to a joint surface between the transmissive element and the phosphor layer, the count of the translucent ceramic components reaches maximum at a distance from the joint surface of not more than 15 µm.

4. The wavelength conversion member according to claim 1, wherein the reflector is fastened by an external force while being in contact with the phosphor layer.

5. The wavelength conversion member according to claim 1, wherein when the wavelength conversion member is irradiated with source light having a specific wavelength at a power density of 5 W/mm$^2$, the fluorescent intensity of the phosphor layer is not less than 50% of the maximum fluorescent intensity of the phosphor layer.

6. A light-emitting device comprising:
   a light source which generates source light having a specific wavelength, and
   the wavelength conversion member described in claim 1 which absorbs the source light and emits light with other wavelength converted from the source light.

7. A method for manufacturing a wavelength conversion member of reflection type configured to convert light with a specific wavelength to light with other wavelength and also configured to reflect the light on a reflection surface, thereby emitting the light as illumination light, the method comprising:
   a step of applying a paste that is a mixture including an inorganic binder, a dispersion medium and phosphor particles to a transmissive element defined by sapphire,
   a step of drying and heat treating the paste applied onto the transmissive element to form a phosphor layer, and
   a step of arranging a reflector including a light-reflective inorganic material onto the phosphor layer and fastening the reflector thus arranged,
   wherein the transmissive inorganic material has a higher coefficient of thermal conductivity than the phosphor layer, and
   wherein the step of applying the paste includes screen printing the paste onto the transmissive element.

* * * * *